(12) United States Patent
Ogata

(10) Patent No.: US 7,671,533 B2
(45) Date of Patent: Mar. 2, 2010

(54) SELF-EMISSION UNIT WITH INTEGRALLY FORMED MODULE AND PROTECTING FRAME

(75) Inventor: Yoshihiro Ogata, Yamagata (JP)

(73) Assignee: Tohoku Pioneer Corporation, Yamagata (JP)

( * ) Notice: Subject to any disclaimer, the term of this patent is extended or adjusted under 35 U.S.C. 154(b) by 704 days.

(21) Appl. No.: 11/520,016

(22) Filed: Sep. 13, 2006

(65) Prior Publication Data

US 2007/0063648 A1 Mar. 22, 2007

(30) Foreign Application Priority Data

Sep. 22, 2005 (JP) ............................. 2005-276216

(51) Int. Cl.
*H01L 51/50* (2006.01)
*H01L 51/52* (2006.01)

(52) U.S. Cl. ...................................... 313/512; 313/506

(58) Field of Classification Search .......... 313/500–512
See application file for complete search history.

(56) References Cited

U.S. PATENT DOCUMENTS 6,822,391 B2 * 11/2004 Yamazaki et al. ........... 313/512

FOREIGN PATENT DOCUMENTS

| JP | 2001210467 A | * | 8/2001 |
| JP | 2005062767 A | * | 3/2005 |
| JP | 2005-151376 A | | 6/2005 |

* cited by examiner

*Primary Examiner*—Mariceli Santiago
(74) *Attorney, Agent, or Firm*—Arent Fox LLP

(57) ABSTRACT

It is an object of the present invention to provide an improved method of manufacturing a self-emission unit including a self-emission module having self-emission elements formed on a substrate, and a frame for protecting the self-emission modules, without carrying out some troublesome steps, thus making it possible to manufacture the self-emission unit in a shortened time. Another object of the present invention is to provide an improved self-emission unit capable of being attached to an attachment base with a high precision. The self-emission unit has a self-emission module and a frame. The frame is provided to cover a part or the whole of the self-emission module so as to protect the same. Further, the frame has fastening sections for attaching the self-emission module to an attachment base. The frame is formed integrally with the self-emission module so that it is possible to avoid some troublesome steps and thus shorten manufacturing time. The foregoing structure also makes it possible to improve an attachment precision when attaching the self-emission unit to an attachment base.

7 Claims, 10 Drawing Sheets

100J

PRIOR ART

100J

100J

PRIOR ART

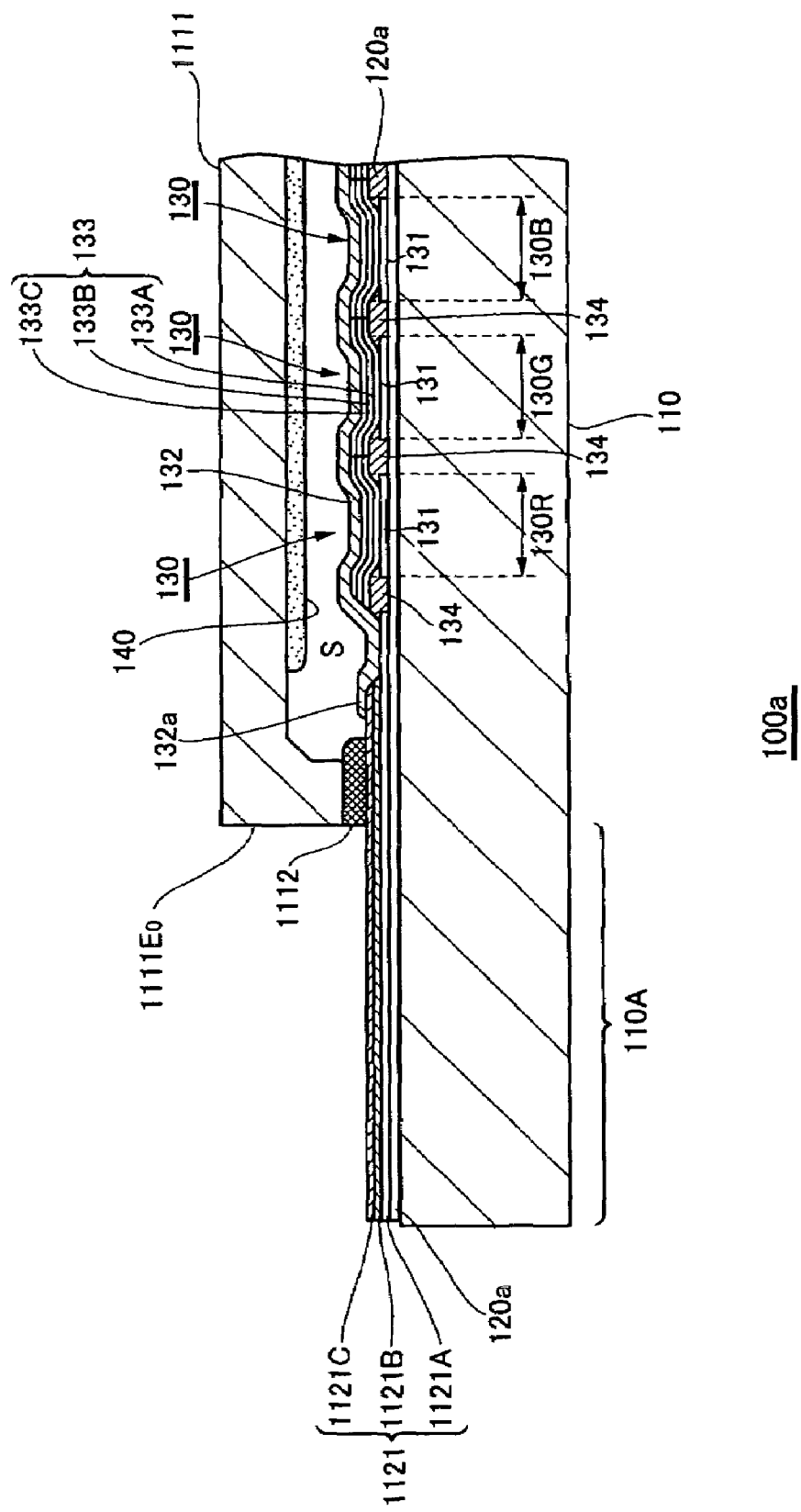

SELF-EMISSION UNIT WITH INTEGRALLY FORMED MODULE AND PROTECTING FRAME

BACKGROUND OF THE INVENTION

The present invention relates to a self-emission unit and a method of manufacturing the same.

The present application claims priority from Japanese Application No. 2005-276216, the disclosure of which is incorporated herein by reference.

There has been known a self-emission display panel formed by using self-emission elements such as organic EL (electroluminescent) elements. There has also been known a display panel such as a liquid crystal display panel formed by using liquid crystal display elements. Actually, a conventional display panel is usually received into a frame (holder) formed in an additional step called frame formation step. For example, Japanese Unexamined Patent Application Publication No. 2005-151376 has disclosed a portable terminal device whose display elements are received into a holder.

As shown in FIG. 1, a conventional self-emission unit 100J includes a self-emission module 10 and a protection frame 30J. The self-emission module 10 comprises a plurality of self-emission elements each having a basic structure including a luminescent functional layer containing a self-emission film, interposed between an upper electrode and a lower electrode formed on a transparent board (substrate) 21. The substrate 21 has lead-out wires 22 which are connected with the lower electrodes and the upper electrodes of the self-emission elements, also electrically connected with a driving circuit (driver) 23. The driving circuit 23 is electrically connected with a flexible wiring board (wiring substrate) 24. Further, a sealing member 25 is provided to air-tightly seal up the self-emission elements formed on the substrate 21, while a protection layer 26 is formed on the lead-out wires 22 and the driving circuit 23. In addition, an identifying information (type number) 27 is printed near the center of the sealing member 25.

On the other hand, the frame 30J is formed in a frame formation step, so that an opening 31 is formed on one side of the frame and claw-like fastening portions 32 are formed near the opening 31 for fixing the frame to the substrate 21, while fastening sections 33 are formed near the back side of the frame for fixing the frame 30J to a frame structure serving as an attachment base. Further, a wiring board receiving recess 34 is formed on one side of the frame 30J and an opening 35 is formed near the center of the frame 31.

FIGS. 2A and 2B are explanatory views showing an assembled self-emission unit 100J. In detail, FIG. 2A is a perspective view showing the back side of the self-emission unit 100J, FIG. 2B is another perspective view showing the front side of the self-emission unit 100J.

The substrate 21 and the frame 30J are assembled together. In detail, as shown in FIG. 1 and FIGS. 2A and 2B, an adhesive material 28 such as a double-sided adhesive tape is attached to the sealing member 25 so as to fit and thus fix the self-emission module 10 in the opening 31 of the frame 30J. At this time, the fastening portions 32 are engaged with the edge portions of the substrate 21 so as to fix together the substrate 21 and the frame 30J. Further, a reflection preventing polarizing plate 29 is disposed on the substrate 21. In such an assembled self-emission unit, an identifying information (type number) printed near the central portion of the sealing member 25 is visible from an opening 35 of the frame 30J. Afterwards, the assembled self-emission unit 100J is engaged into a frame structure such as cellular phone and fixed in position by virtue of the fastening sections 33.

As described above, the foregoing self-emission unit 100J requires an assembling process for assembling together the self-emission module 10 and the frame (holder made of resin) 30 formed in advance at a step different from a step for making the self-emission module 10, thus requiring an increased manufacturing time. Moreover, the assembling process requires a troublesome step for disposing an adhesive material 28 such as a double-sided adhesive tape between the self-emission module 10 and the frame 30J, forming another cause for an increased manufacturing time. Besides, during the assembling process, the edge portions of the transparent substrate 21 are likely to wound an assembling machine or a human operator performing the assembling operation.

In addition, the conventional self-emission unit 100J requires another step for adjusting an attachment position when assembling together the frame 30 and the self-emission module 10, and a further step for adjusting another attachment position when attaching the self-emission unit 100J to an attachment base. As a result, there would be only a low positional accuracy for the position of the self-emission module 10J with respect to an attachment base.

SUMMARY OF THE INVENTION

The present invention is to solve the above-discussed problem and makes this as one of its tasks. Namely, it is an object of the present invention to provide an improved method of manufacturing a self-emission unit including a self-emission module having self-emission elements formed on a substrate, and a frame for protecting the self-emission module, without having to carrying out some troublesome steps, thus making it possible to manufacture a self-emission unit within only a shortened time. Another object of the present invention is to provide an improved self-emission unit capable of being attached to an attachment base with a high precision.

In order to achieve the above objects, the present invention is characterized by at least the following aspects.

According to one aspect of the present invention, there is provided a self-emission unit comprising: a self-emission module having one or more self-emission elements each including a lower electrode formed on a substrate directly or through other layers, film layers laminated on the lower electrode, and an upper electrode formed over the film layers; and a frame covering a part or the whole of the self-emission module so as to protect the self-emission module. In particular, the frame is formed integrally with the self-emission module.

According to another aspect of the present invention, there is provided a method of manufacturing a self-emission unit, comprising the steps of: forming a self-emission module having one or more self-emission elements each including a lower electrode formed on a substrate directly or through other layers, film layers laminated on the lower electrode, and an upper electrode formed over the film layers; and forming a frame covering a part or the whole of the self-emission module so as to protect the self-emission module formed in the previous step. Particularly, in the frame formation step the frame is formed integrally with the self-emission module.

BRIEF DESCRIPTION OF THE DRAWINGS

These and other objects and advantages of the present invention will become clear from the following description with reference to the accompanying drawings, wherein:

FIGS. 2A and 2B are perspective views showing an assembled self-emission unit 100J, in which FIG. 2A is a perspective view showing a backside of the self-emission unit 100J, and FIG. 2B is a perspective view showing the front side of the self-emission unit 100J;

FIGS. 5A and 5B are views showing a self-emission unit 100 according to one embodiment of the present invention illustrated in FIG. 4, in which FIG. 5A is a perspective view showing a front side of the self-emission unit 100 and FIG. 5B is a perspective view showing a backside of the self-emission unit;

FIGS. 6A and 6B are views showing a self-emission module 10 of the self-emission unit 100 illustrated in FIG. 5, in which FIG. 6A is a perspective view showing a front side of the self-emission module 10 and FIG. 6B is a perspective view showing a backside of the self-emission module;

FIG. 10 is a sectional view showing a self-emission unit according to another embodiment of the present invention.

DETAILED DESCRIPTION OF THE PREFERRED EMBODIMENTS

A self-emission unit according to one embodiment of the present invention includes a self-emission module and a frame. The self-emission module comprises one or more self-emission elements each including a lower electrode formed on a substrate directly or through other layers, film layers laminated on the lower electrode, and an upper electrode formed over the film layers. The frame is provided to cover a part or the whole of the self-emission module so as to protect the self-emission module. Further, the frame has attachment portions for attaching the self-emission module to an attachment base. The self-emission unit of the present invention is such that the frame is formed integrally with the self-emission module. In fact, the frame is formed integrally with the self-emission module by frame-molding method or two-liquid mixing method using resin material.

The self-emission unit having the above-described structure includes a self-emission module having self-emission elements formed on a substrate, and a frame integrally formed with the self-emission module for protecting the self-emission module, so that it is possible to avoid troublesome steps so as to shorten manufacturing time. Different from the present invention, a conventional self-emission unit needs to form the self-emission module and the frame in separate steps and then assemble them together, followed by attaching the self-emission unit to an attachment base, thus resulting in a low precision in attachment position. To solve this problem, the self-emission unit of the present invention is fabricated by integrally forming the self-emission module and the frame, so that it is possible to ensure a higher precision in attachment position than a conventional self-emission unit.

In the following, one embodiment of the present invention will be described with reference to the accompanying drawings.

Figure 3:
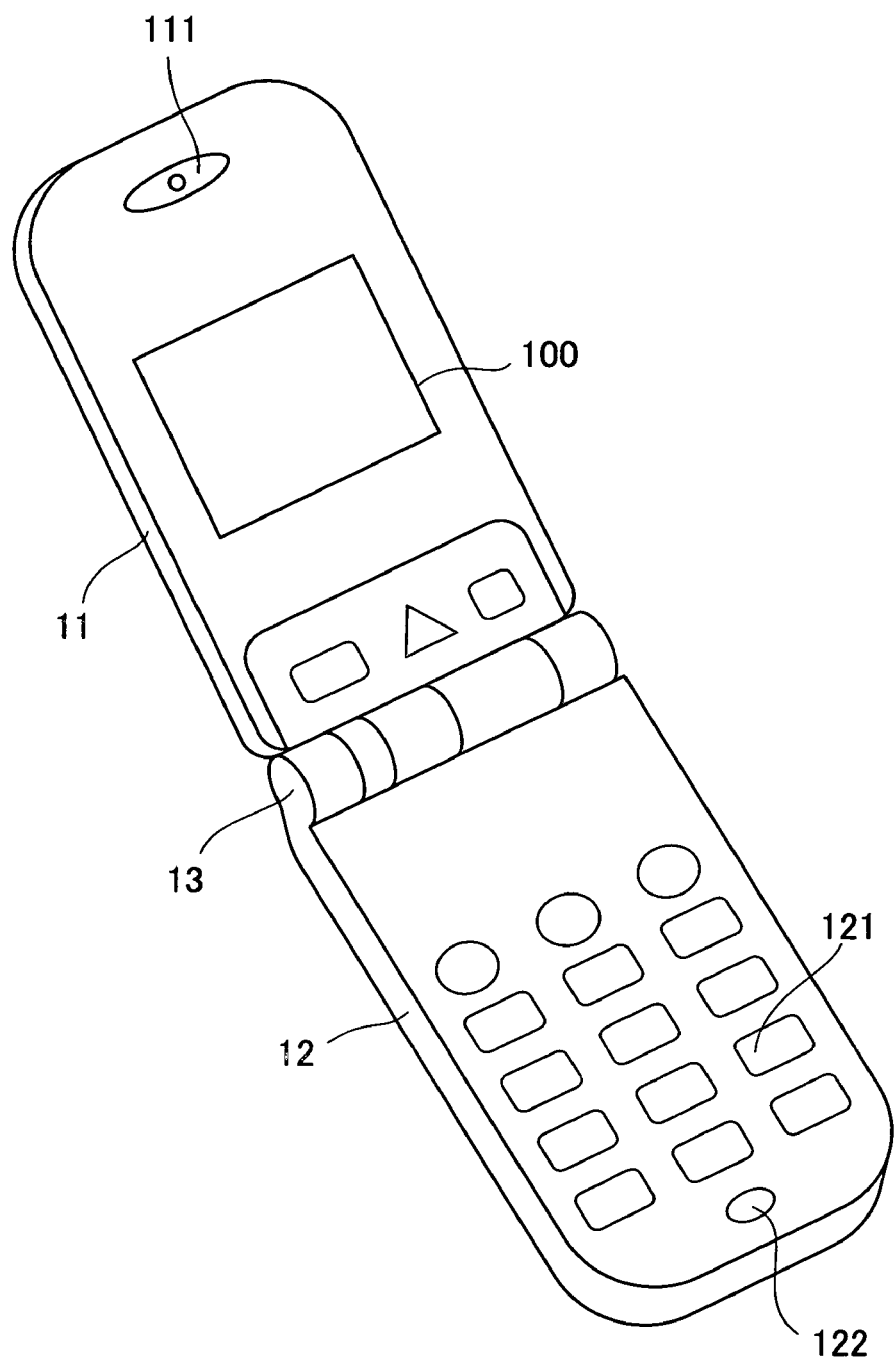
FIG. 3 is a perspective view showing a cellular phone adopting a self-emission unit 100 formed according to one embodiment of the present invention.

FIG. 3 is a perspective view showing a cellular phone formed by using a self-emission unit 100 fabricated according to one embodiment of the present invention. On the other hand, although the present embodiment shows that the self-emission unit 100 is applied to a cellular phone, such a self-emission unit 100 can also be applied to any other types of electronic devices.

The cellular phone 1 according to the present embodiment is a folding cellular phone shown in FIG. 3, including a first frame section (receiver) 11, a second frame section 12 (transmitter) and a hinge section 13.

The first frame section 11 has a telephone-receiver function including a self-emission unit (display) which is located near the center of the frame section and a speaker 111 near an upper edge thereof. The second frame section 12 has a transmitting function including an operating panel 121 located near the center of the frame section, and a microphone 122 positioned near a lower edge thereof. The hinge section 13 is provided to connect together the first frame section 11 and the second frame section 12 so that they are pivotable. Moreover, the cellular phone 1 has a control circuit for controlling the entire device including the self-emission unit 100, the speaker 111, the operating panel 121, the microphone 122, and a communication circuit or the like. The self-emission unit 100 serves as an embodiment of the present invention.

Figure 4:
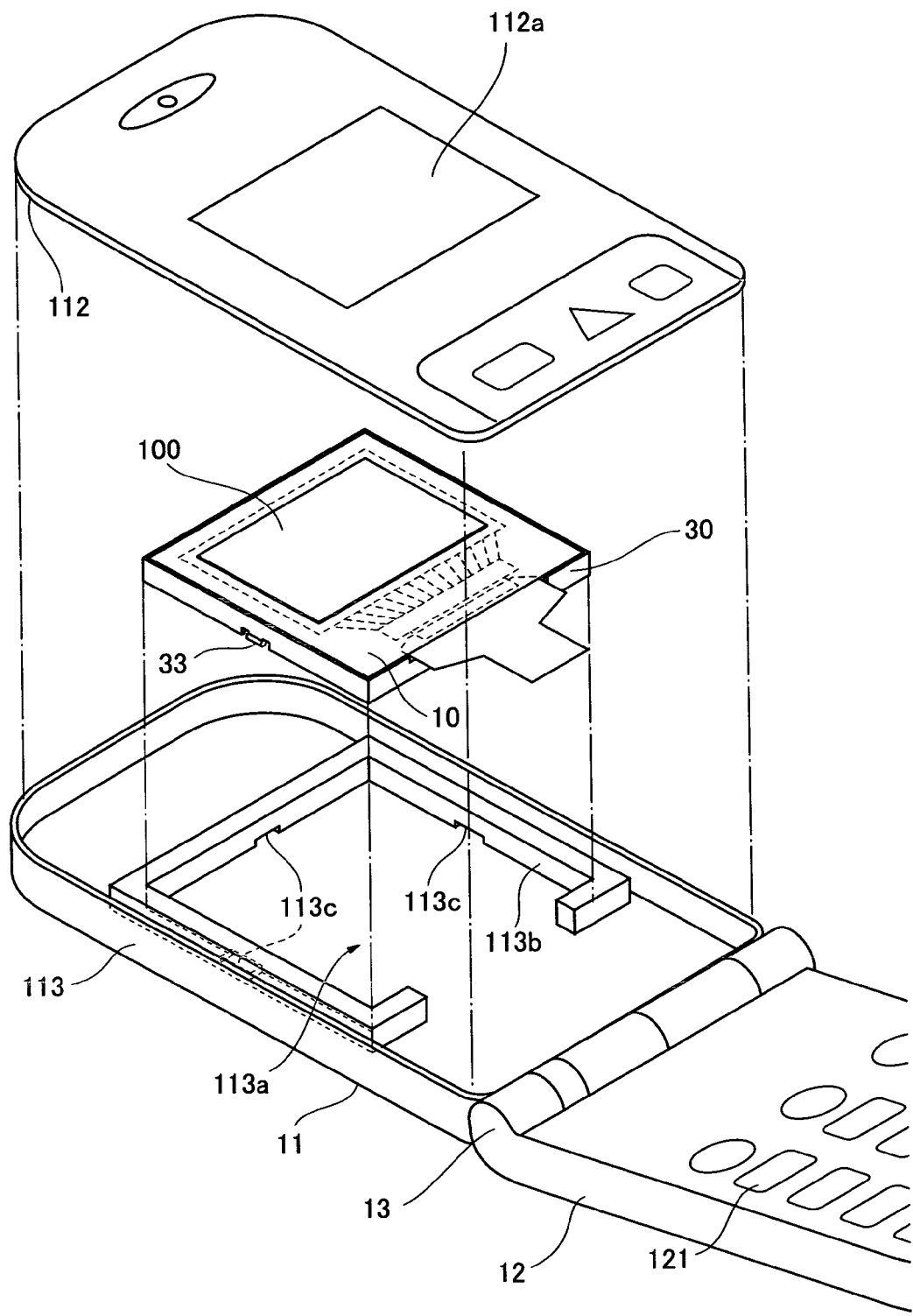
FIG. 4 is an exploded perspective view showing a first frame structure 11 illustrated in FIG. 3.
Figure 5:
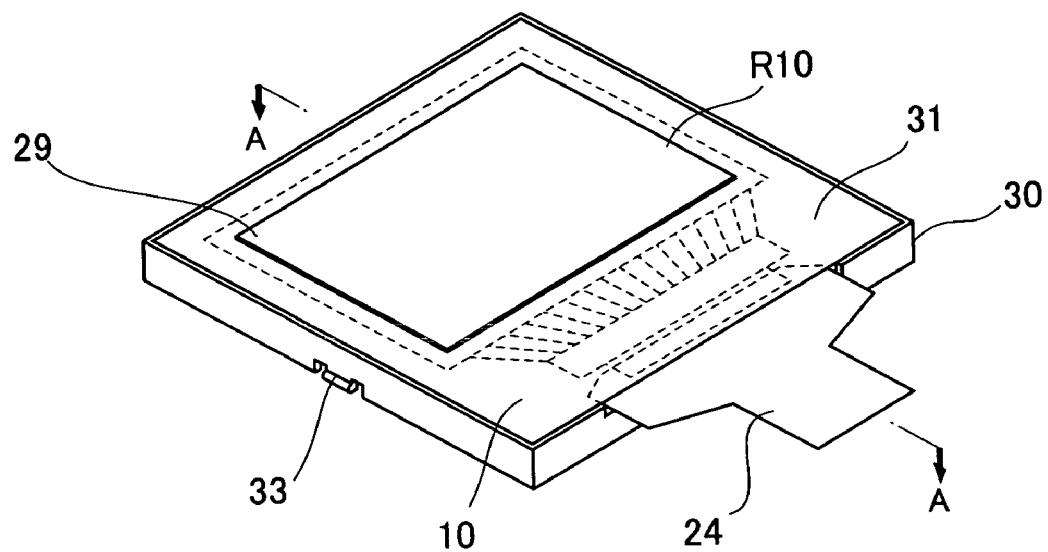
Figure 5:
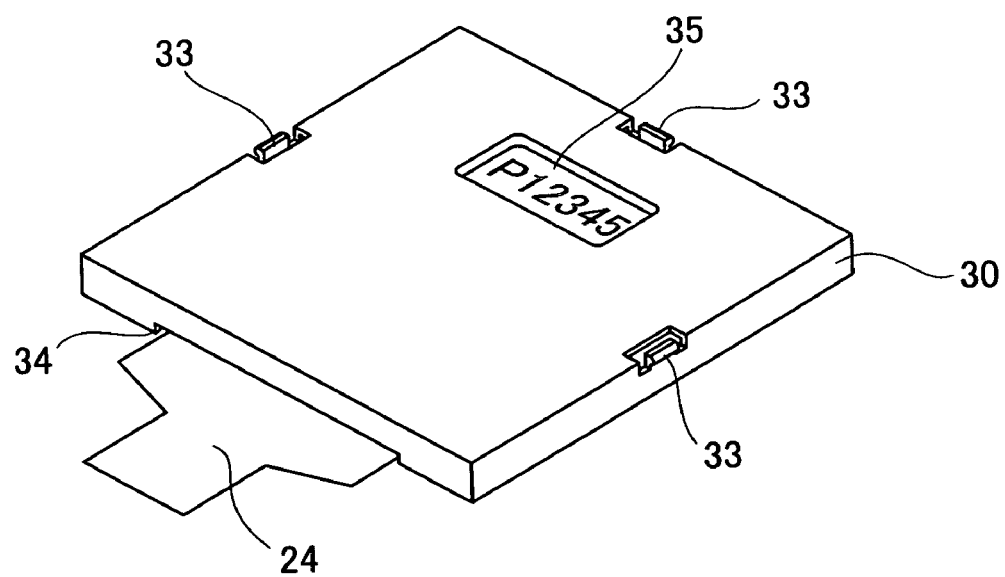
Figure 6A:
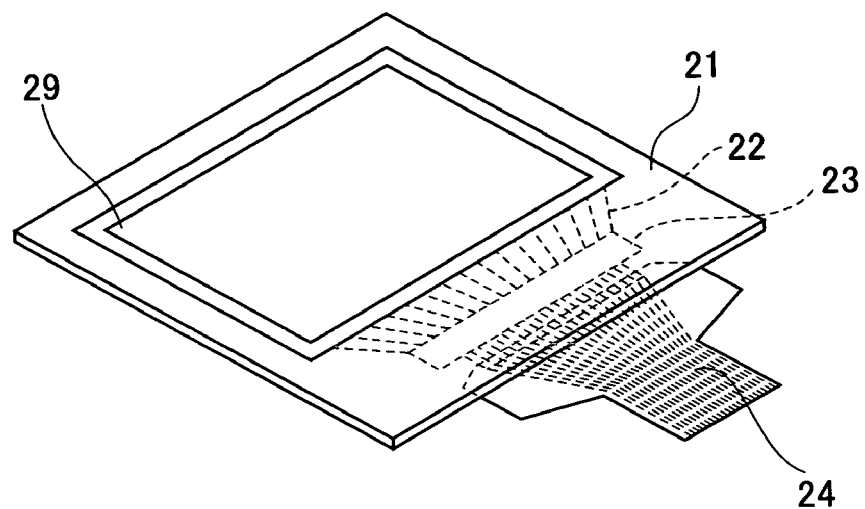
Figure 6B:
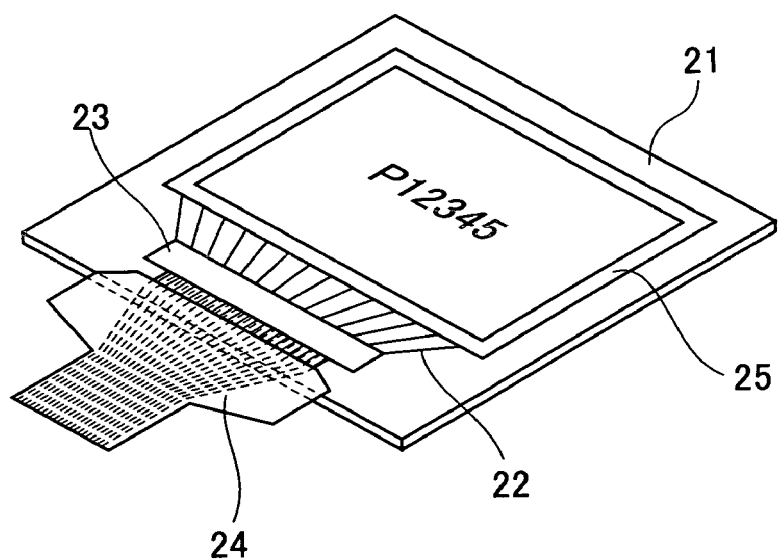
Figure 7:
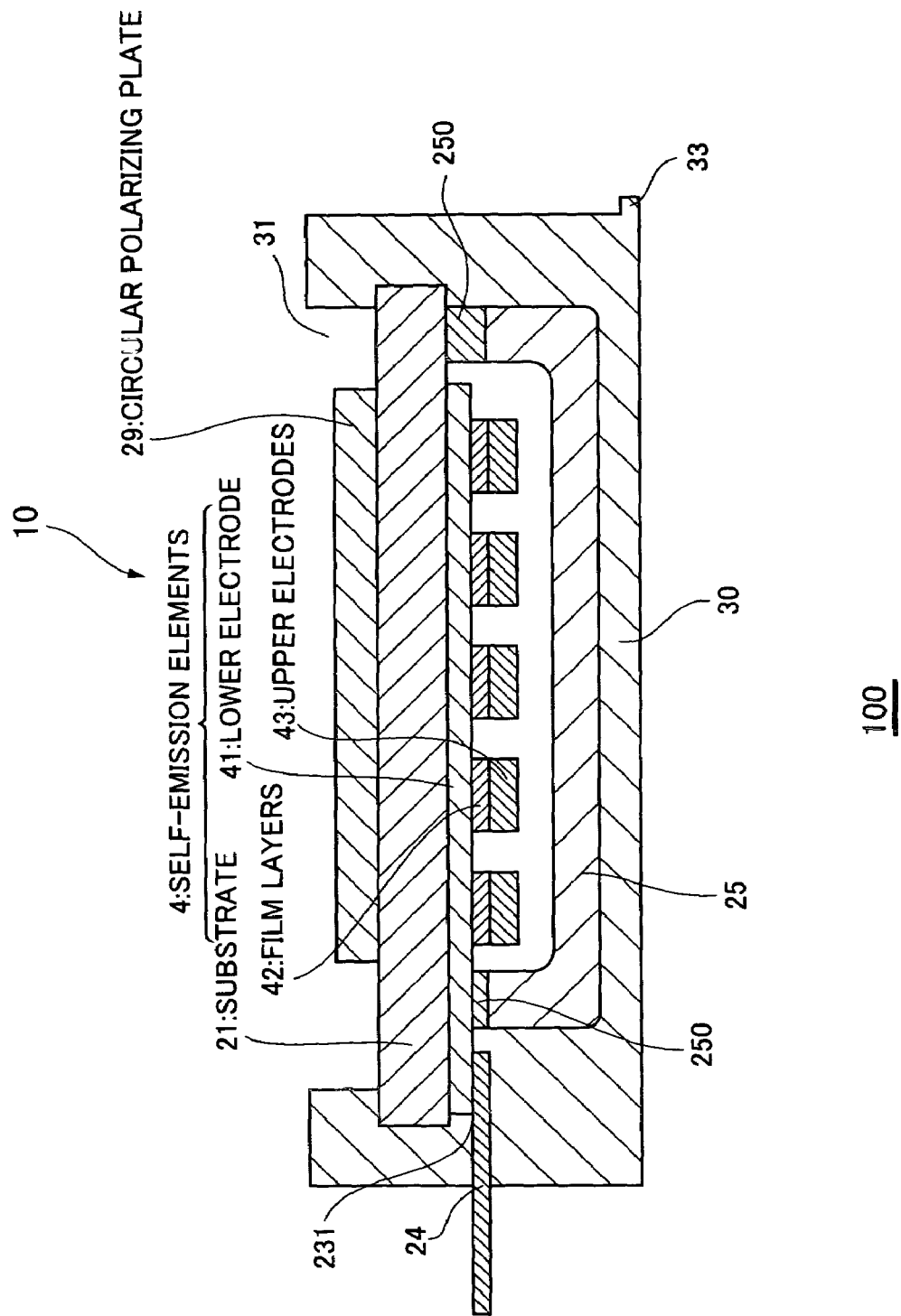
FIG. 7 is a sectional view taken through A-A line on the self-emission unit 100 shown in FIG. 5A.

FIG. 4 is an exploded perspective view showing the first frame section 11 illustrated in FIG. 3. FIGS. 5A and 5B are perspective views showing the self-emission unit 100 formed according to one embodiment of the present invention. In detail, FIG. 5A is a perspective view showing the front side of the self-emission unit 100, and FIG. 5B is a perspective view showing the backside of the self-emission unit 100. FIGS. 6A and 6B are explanatory views showing the self-emission module 10 to be installed in the self-emission unit 100 illustrated in FIGS. 5A and 5B. In detail, FIG. 6A is a perspective view showing the front side of the self-emission module 10 and FIG. 6B is a perspective view showing the backside of the module 100. FIG. 7 is a cross sectional view taken along A-A line shown in FIG. 5 in which the driving circuit 23 and the like are omitted.

As shown in FIG. 4, the first frame section 11 has an upper surface member 112, a self-emission unit 100, and an attachment base (case) 113. The upper surface member 112 is disposed on the top surface of the self-emission unit 100 to protect the self-emission unit 100. Further, as shown in FIG. 4, the upper surface member 112 has a light transmitting section 112a formed in a position corresponding to a display area of the self-emission unit 100.

The self-emission unit 100 includes a self-emission module 10 and a frame (holder) 30. The frame 30 covers a part or the whole of the self-emission module 10 so as to protect the self-emission module 10. Further, the frame 30 has fastening sections 33 for attaching the self-emission module 10 to the first frame section 11. In more detail, as shown in FIGS. 5A, 5B and 7, the frame 30 of the present embodiment has an opening 31 for covering the back and side faces of the substrate 21, and the fastening sections 33 for attaching the frame 30 to the attachment base 113. In further detail, as shown in FIGS. 4, 5A and 5B, the fastening sections 33 have claw-like fastening portions convexly formed on the side faces of the frame 30. Moreover, as shown in FIG. 5a, another opening 35 is formed near the central portion on the back side of the frame 30, thereby making it possible to visualize, through the opening 35, an identifying information (type number) 27 printed near the central portion of the sealing member 25. In practice, the frame 30 and the self-emission unit 10 are formed into an integral body using one of various manufacturing methods such as frame-molding or two-liquid molding based on a resin material which will be described later.

The attachment base 113 has a mounting section 113a corresponding to the configuration of the self-emission unit 100. When the self-emission unit 100 is fitted into the first frame section 11, the unit 100 can be fixed within the frame section. In detail, as shown in FIG. 4, the mounting section 113a has a convex member 113b corresponding to outer side faces of the self-emission unit 100. Further, the convex portion 113b has engagement recesses 113c in positions corresponding to the fastening sections 33. In present embodiment, as shown in FIG. 4, the engagement recesses 113c are formed on the inner side face of the convex member 113b. Upon engaging the claw-like fastening sections 33 in the engagement recesses 113c, the self-emission unit 100 can be exactly fixed in the engagement base 113.

Further, as shown in FIGS. 6A, 6B and 7, the self-emission module 10 has a lower electrode 41 formed on the substrate 21 directly or through other layers, film layers (luminescent functional layers) 42 including a self-emission layer are formed on the lower electrode 41, and upper electrodes 43 are formed on the film layers 42, thereby completing one or more self-emission elements 4. Moreover, as shown in FIGS. 6A and 6B, the self-emission module 10 has lead-out wires 22 connected to the lower electrode 41 and the upper electrodes 43, while a driving circuit (driver) 23 for driving the self-emission elements 4 is electrically connected with the lead-out wires 22, followed by electrically connecting a flexible wiring board (wiring substrate) 24 to the driving circuit 23 through an electrically conductive material such as ACF (Anisotropic Conductive Film). In detail, one end of the wiring board 24 is electrically connected to the driving circuit 23 and the other can be connected to an external circuit such as a control circuit (not shown). Finally, a sealing member 25 is attached through an adhesive layer 250 to air-tightly seal up the self-emission elements formed on the substrate 21.

The self-emission module 10 of the present embodiment does not have a protection layer for protecting the lead-out wires 22, on the lead-out wires 22 and the driving circuit 23. However, in the self-emission unit 100 of the present embodiment, since the self-emission module 10 and the frame 30 are formed into an integral body, the lead-out wires and the driving circuit 23 may be directly protected by the frame 30. In this way, it is possible to shorten manufacturing time, reduce production cost, and produce an emission unit having a reduced thickness. Moreover, even with respect to a self-emission unit 100 having a curved surface or a complex configuration, it is still possible to form the self-emission module 10 and the frame 30 into an integral body.

Further, with regard to the self-emission unit 100 of the present embodiment, since the self-emission module 10 and the frame 30 are formed into an integral body, the sealing member 25 and the frame 30 can be tightly combined together. Therefore, it is not necessary to arrange the sealing member 25 in the same manner as required by the above-described conventional self-emission module 10J. In this way, it is possible to shorten a manufacturing time, reduce a production cost, and produce an emission unit having a reduced thickness.

Moreover, with regard to the self-emission unit 100 of the present embodiment, since the self-emission module 10 and the frame 30 are formed into an integral body, it is not necessary to apply an adhesive material such as a double-sided adhesive tape between the sealing member 25 and the frame 30. Therefore, it is possible to shorten a manufacturing time, reduce a production cost, and produce an emission unit having a reduced thickness.

In practice, the frame 30 can be formed into any desired configuration according to the shapes, bending strengths, installing strengths, heat dissipation structures, protection structures of the self-emission module 10 and the attachment base 113. In more detail, the frame 30 of the present embodiment is formed integrally with the self-emission module 10 to cover the sealing member 25 partially or entirely, the driving circuit 23 partially or entirely, and the self-emission module 10 partially or entirely except the display area R10, in a manner shown in FIG. 5B. Further, the frame 30 is integrally formed with the self-emission module 10 to cover the wiring board 24 partially or entirely, as well as the edge portion of the substrate 21 partially or entirely.

Figure 8:
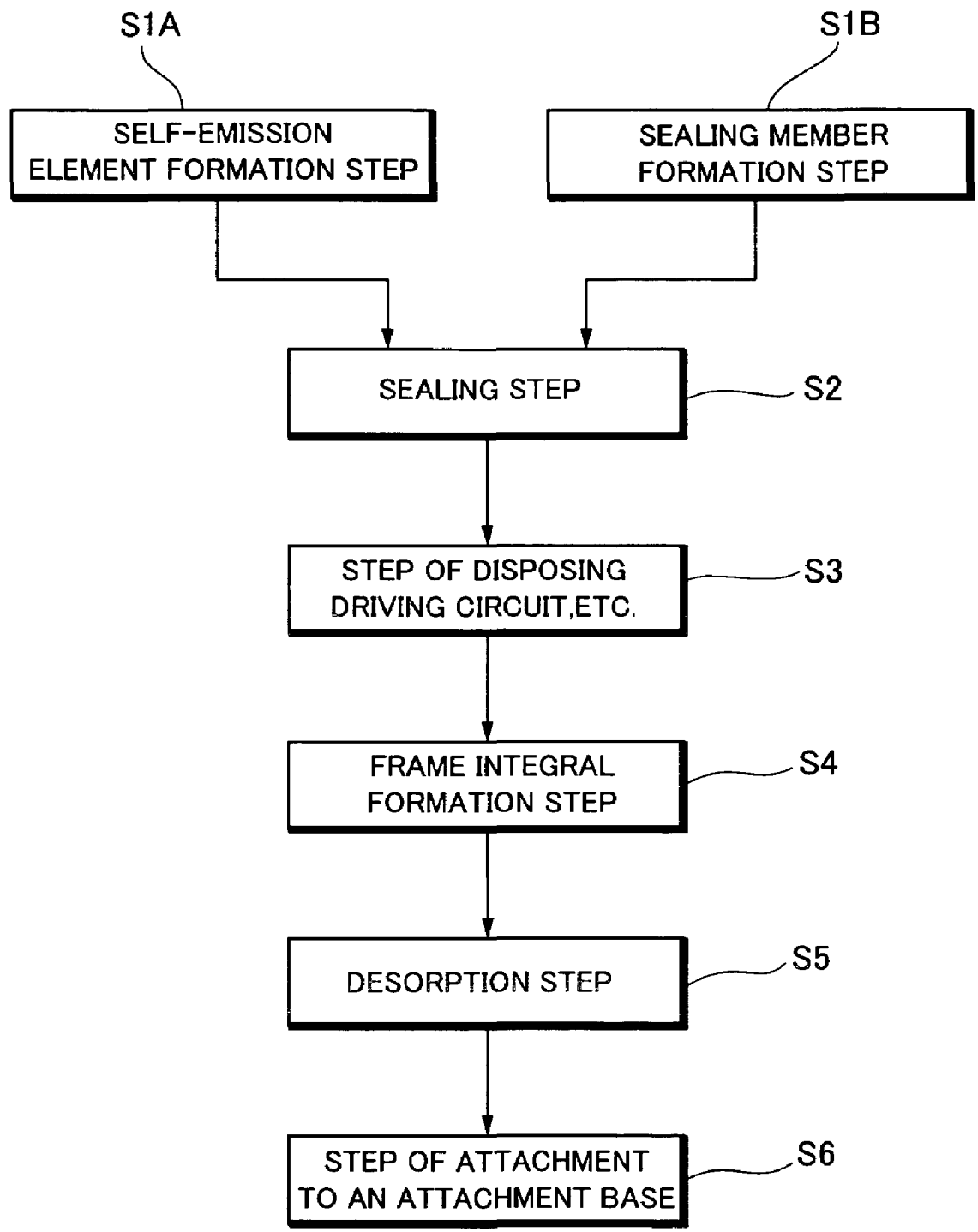
FIG. 8 is a flow chart showing a method of manufacturing the self-emission unit 100 according to one embodiment of the present invention illustrated in FIGS. 3 to 7.

FIG. 8 is a flowchart showing a method of manufacturing the self-emission unit 100 illustrated in FIGS. 3 to 7 according to one embodiment of the present invention. FIGS. 9A to 9D are explanatory views showing the method of manufacturing the self-emission unit 100. In the following, description will be given to explain the method of manufacturing the self-emission unit 100 having the foregoing structure, with reference to FIGS. 3 to 9D.

Figure 9A:
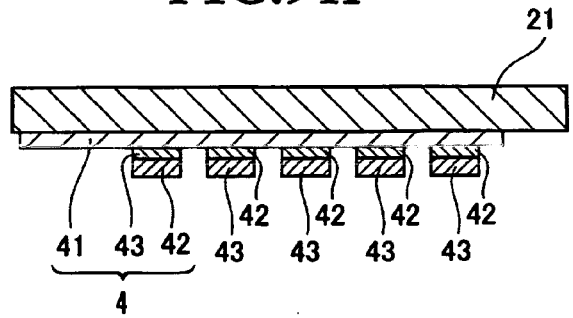
FIGS. 9A to 9D are explanatory views showing the method of manufacturing the self-emission unit 100 according to one embodiment of the present invention illustrated in FIGS. 3 to 7.

At first, one or more self-emission elements are formed in step S1A. In detail, as shown in FIG. 9A, a lower electrode 41 is formed on a transparent substrate 21 (such as glass) directly or through other layers. Then, film layers (luminescent functional layers) 42 including a self-emission layer are formed on the lower electrode 41, followed by forming upper electrodes 43 on the film layers 42, thereby forming one or more self-emission elements 4 on the substrate 21.

Afterwards, a sealing member is formed in step S1B. In detail, a process such as etching or blasting is performed on a plate-like member such as a glass plate, a plastic plate, and a metal plate, thereby forming a sealing space 25a. However, it is also possible to form the sealing space 25a by deep digging or frame molding.

Figure 9B:
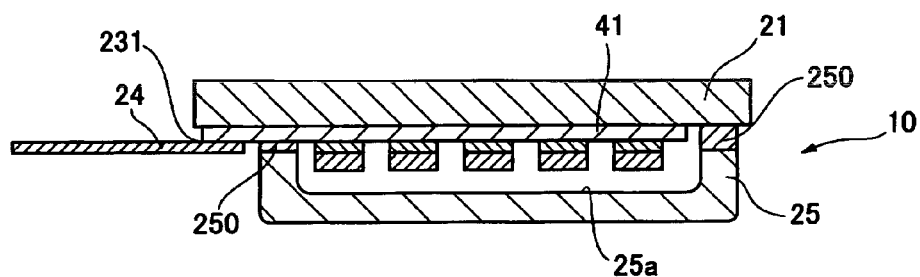

Next, as shown in FIG. 9B, step S2 is carried out to air-tightly seal the self-emission elements 4 formed on the substrate 21 by virtue of an adhesive layer 250. On the other hand, it is also allowed not to form the sealing space 25a in the sealing member 25, but to mix spacers in the adhesive agent 250 and use the adhesive agent to bond together the sealing member 25 and the substrate 21 with a gap formed therebetween. In addition, it is further possible to obtain an air-tight sealing effect using a solid sealing method in which a sealing material which is resin or the like is solidified between the plate-like sealing member 25 and the substrate 21.

Subsequently, at step S3 shown in FIG. 9B, a flexible wiring board (wiring substrate) 24 is disposed on the substrate 21 through the driving circuit 23, an electrically conductive material 231 such as an anisotropic conductive film (ACF) (which are all not shown in the drawings), thereby forming a self-emission module 10.

Figure 9C:
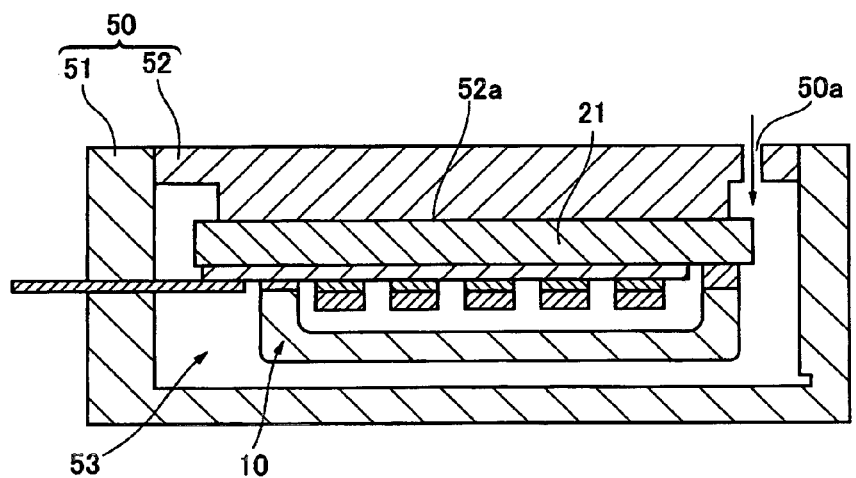

In step S4, an integral frame formation is carried out using one of various methods including frame molding or two-liquid mixing based on a resin material. In more detail, the self-emission module 10 is at first set in a mold 50 which includes an external mold 51 and an inner mold 52, as shown in FIG. 9C. The external mold 51 includes an internal space whose inner surface is formed corresponding to the shape of the frame 30. Further, as shown in FIG. 9C, the inner mode 52 is placed in the internal space of the external mold 51, in a manner such that the self-emission module 10 can be fixed in position on one side 52a of the inner mode 52 by means of an adhesive agent or a vacuum adhesion device. In this way, an internal space 53 defined by the external mold 51, the inner mold 52, and the self-emission module 10 can be set to form the frame 30. Next, a material for forming the frame 30 is introduced through a material supply hole 50a of the mold 50, thereby forming the frame 30 which is integral with the self-emission unit 10, thus producing the self-emission unit 100.

In an integral frame formation step, a frame molding method can be used to at first set the self-emission module 10 in the mold 50, followed by introducing a melted resin material into the mold 50. After having received a thermal change for several hours, the melted resin is hardened into a desired shape, thus producing an integrally formed frame.

For example, when a high temperature (for example, about 200 to 300° C.) extrusion material is injected into the mold 50, it is preferable to employ a device for introducing a cooling liquid into the mold 50 so as to cool the mold 50, or to use an alternative device capable of directly cooling the self-emission module 10. In this way, provision of the cooling device makes it possible to prevent a damage to the self-emission elements 4, which would otherwise be caused due to a thermal conduction towards the self-emission module 10.

Moreover, in order to prevent the aforementioned damage possibly caused by a heat transfer towards the self-emission module 10, it is allowed to employ two-stage frame molding. In detail, at first, a low temperature extrusion material is used to form the frame 30 on to the self-emission module 10. Then, after a predetermined time, a high temperature extrusion material is used to perform an injection molding on the surface of the formed frame 30. In this way, by at first combining the low temperature extrusion material to the self-emission module 10, it is possible to reduce an undesired heat transfer towards the self-emission module 10, thereby preventing the aforementioned damage possibly caused due to a heat being transferred to the self-emission module 10. In this way, although a high temperature extrusion material gets in contact with the surface of the formed frame, since the first layer is formed by a low thermally conductive resin, it is possible to reduce an undesired heat transfer, thereby preventing the aforementioned damage possibly caused due to a heat being transferred to the self-emission module 10.

Moreover, under a condition in which the self-emission module 10 has been set in the mold 50, two sorts of liquids including an epoxy resin can be introduced into the mold 50, followed by solidifying the liquid mixture by virtue a chemical reaction, thereby integrally forming a frame having a desired shape. In addition, rather than using the above-described manufacturing method, it is possible to employ a conventional manufacturing method to integrally form the frame 30 on to the self-emission module 10 so as to produce the self-emission unit 100.

Figure 9D:
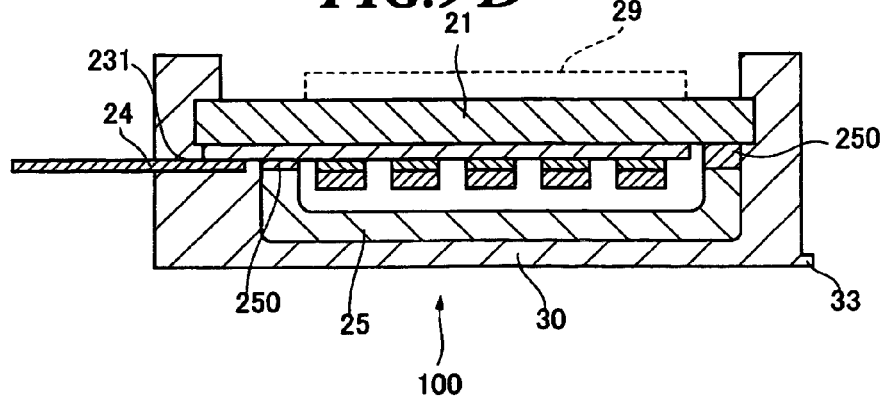

Next, a desorption process is performed in step S5. In detail, as shown in FIGS. 9C and 9D, the external mold 51 and the inner mold 52 of the mold 50 are moved in mutually opposite directions so as to remove the self-emission unit 100 from the mold 50, thereby taking out the self-emission unit 100. Then, a circular polarizing plate 29 for preventing an undesired reflection is disposed on the displaying side of the substrate 21 of the self-emission unit 100.

Subsequently, in step S6, the self-emission unit 100 is installed on to an attachment base 113. For example, as shown in FIG. 4, the self-emission unit 100 is attached to a predetermined position on the attachment base 113.

As described above, the self-emission unit 100 has the self-emission module 10 and the frame 30. The frame 30 covers a part or the whole of the self-emission module 10 so as to protect the self-emission module 10. The frame 30 also has fastening sections 33 for attaching the self-emission module 10 to the attachment base 113. In this way, since the frame 30 is integrally formed with the self-emission module 10, it is possible to complete the manufacturing process in a shortened time period without carrying out any complex steps.

A liquid crystal display panel usually requires a backlight so that it is impossible to directly use a resin to form a frame integrally with the liquid crystal module. Different from the liquid crystal display panel, the self-emission unit 100 of the present invention utilizes a self-emission module such as an organic EL module, so that it is possible to use a resin to form the self-emission module 10 integrally with the frame 30 without a backlight.

With regard to a conventional self-emission unit 100, after the self-emission module 10 and the frame 30J have been formed separately, they are engaged with each other to form the self-emission unit 100. However, when a self-emission unit 100 is being assembled, edge portions of the glass substrate of the self-emission module will sometimes wound an assembling apparatus or a human operator. Different from the conventional self-emission unit, the self-emission unit 100 of the present invention allows the self-emission module 10 and the frame 30 to be integrally formed together, so that it is possible to prevent edge portions of the glass substrate of the self-emission module from wounding an assembling apparatus or a human operator, thereby ensuring an increased safety during a manufacturing process.

Moreover, a conventional self-emission unit requires that when the self-emission module 10 and the frame 30J are being combined together, a double-sided adhesive tape being disposed between the self-emission module 10 and the frame 30J, and that the sealing member and the frame be fixed. Different from the conventional self-emission unit, the self-emission unit 100 of the present invention allows the self-emission module 10 and the frame 30 to be integrally formed together, thereby ensuring a tight adhesion between the two members without using the double-sided adhesive tape. In this way, it is not necessary to dispose an adhesive agent, so that it is possible to shorten a manufacturing time. Moreover, since it is not necessary to dispose an adhesive agent between the self-emission module 10 and the frame 30, it is possible to produce a self-emission unit 100 having a reduced thickness.

Besides, a conventional self-emission unit needs to form a protection layer for protecting the lead-out wires 22 and the driving circuit 23, while the self-emission unit 100 of the present invention allows the self-emission module 10 and the frame 30 to be integrally formed together, thereby making it possible to directly protect the lead-out wires 22 by virtue of the frame 30, thus making it possible to omit a protection layer and thus a step of forming such a protection layer. In this way, it is possible to shorten a manufacturing time and to produce a thickness-reduced self-emission unit 100 by omitting the protection layer.

Further, the method of manufacturing the self-emission unit 100 according to the present invention makes it possible to omit the steps of disposing an adhesive agent, assembling a frame, and forming a protection layer, so that it is possible to reduce the manufacturing cost.

Figure 1:
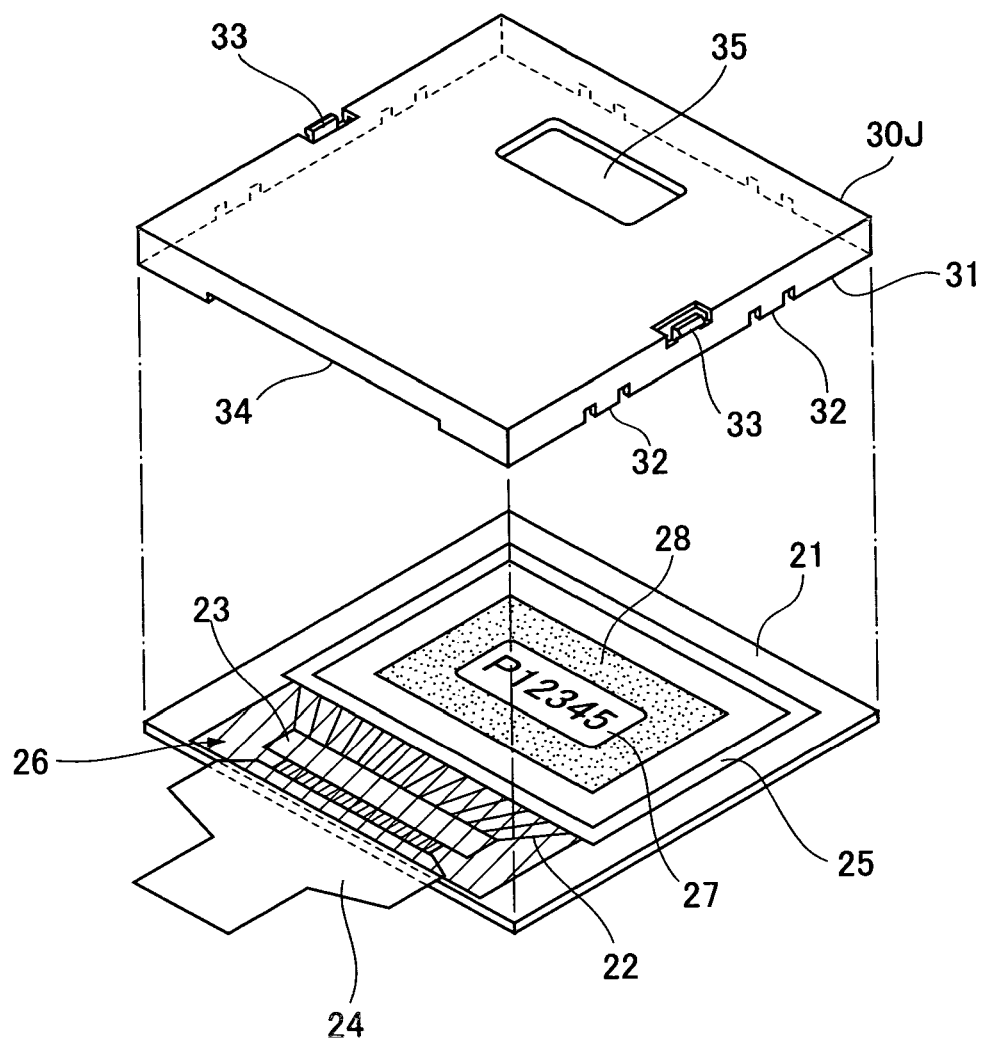
FIG. 1 is an exploded perspective view showing a conventional self-emission unit 100J.
Figure 2A:
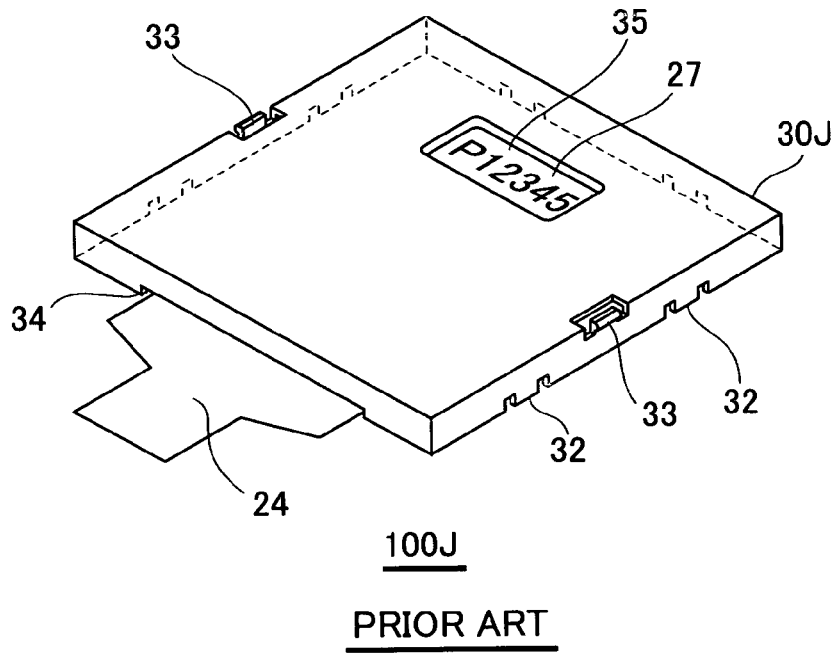
Figure 2B:
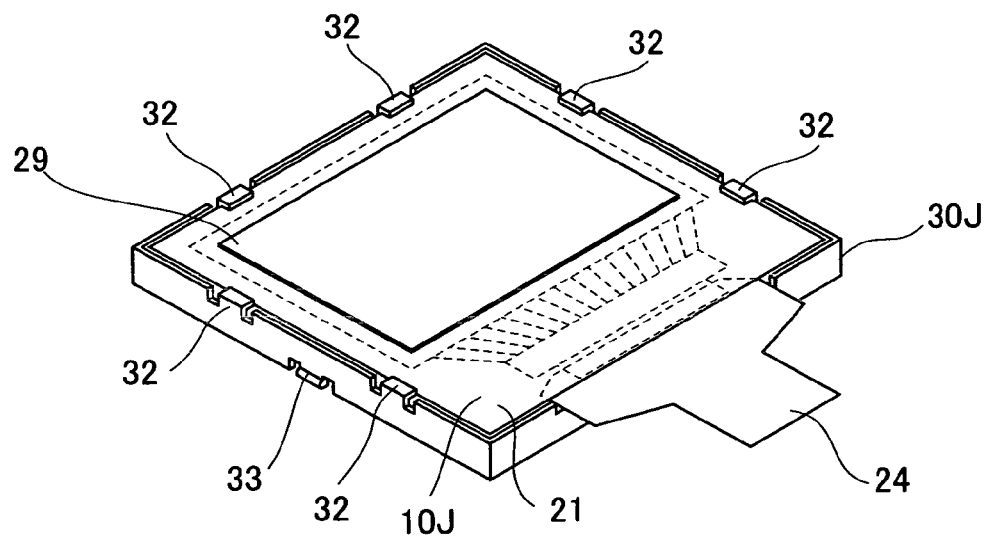

In the conventional self-emission unit shown in FIG. 1, the frame 31J has claw-like fastening portions 32 for fixing the self-emission module 10. Different from the conventional self-emission unit, the self-emission unit 100 of the present invention allows the frame 30 to be integrally formed on to the self-emission module 10, so that it is not necessary to form any fastening portions in the frame 30, thereby simplifying the manufacturing process and thus reducing the manufacturing cost.

Besides, a conventional self-emission unit requires an attachment position adjustment when the self-emission module 10 is fitted to the frame 30J, and another attachment position adjustment when the self-emission unit is attached to an attachment base. That is, it is required to perform two attachment position adjustments, resulting in a low final attachment precision of the self-emission unit with respect to an attachment base. Different from the conventional self-emission unit, the self-emission unit 100 of the present invention has the frame 30 integrally formed with the self-emission module 10, so that an only position adjustment necessary to be carried out is to perform a position adjustment between the self-emission unit 100 and the attachment base 113, thereby ensuring an improved final attachment precision of the self-emission unit 100 with respect to the attachment base 113. In addition, it is possible to simplify an operation for attaching the self-emission unit 100 to the attachment base 113.

However, the present invention is by no means to be limited to the above-described embodiments.

For example, although the self-emission unit 100 of the present embodiment has the claw-like fastening portions serving as attachment units in the frame 30, this should not form any limitation to the present invention. Actually, it is possible to provide a device for fixing the self-emission unit 100 to the attachment base 113.

Moreover, although the present embodiment shows that the self-emission unit 100 is applied to a cellular phone having a single-sided display section, this should not form any limitation to the present invention. In fact, it is also possible for the self-emission unit 100 of the present invention to be applied to a double-sided display device.

The self-emission unit 100 discussed above is formed such that its substrate 21 mounts the lead-out wires 22 which are electrically connected to the lower and upper electrodes, the driving circuit 23, and the wiring board (flexible substrate) 24 electrically connected with the driving circuit 23. However, this should not form any limitation to the present invention. Actually, it is also possible to omit one or both of the driving circuit 23 and the wiring board 24.

Besides, although the self-emission module 10 discussed above is provided with the sealing member 25, it is also possible to directly form the frame 30 on to the self-emission module 10 so that both members become integral with each other, without providing the sealing member 25. In this way, it is possible to omit the step of providing the sealing member 25 and thus shorten a manufacturing time.

Actually, the self-emission unit 100 of the present invention can be applied not only to a cellular phone, but also to a car audio device, a car instrument panel, a personal computer, PDA (Personal Digital Assistant) device, an electronic notebook, a transceiver, a television set, a backlight of a liquid crystal display, a visual device, a flash device, a light, an illumination device, a photo-electricity converter, an optical communication device, and the like.

However, the self-emission unit 100 should not be limited to the foregoing embodiment. In the following, description will be given to explain a detailed structure of an organic EL unit 100a which serves as one example of the above-described self-emission unit 100, with reference to FIG. 10.

As shown, an organic EL unit 100a is formed by interposing an organic layer 133 between first electrodes (first electrically conductive layer) 131 on one hand and second electrodes (second electrically conductive layer) 132 on the other, thereby forming a plurality of organic EL elements 130 on the substrate 110. In an example shown in FIG. 10, $SiO_2$ coating layer 120a is formed on the substrate 110, and a plurality of first electrodes 131 consisting of transparent electrode material such as ITO (Indium Tin Oxide) and serving as anodes are formed on this coating layer 120a. Further, second electrodes 132 consisting of a metal such as Al and serving as cathodes are formed over the first electrodes 131, thereby forming a bottom emission type panel capable of emitting light from the substrate 110 side. Moreover, the panel also contains an organic layer 133 including a positive hole transporting layer 133A, a luminescent layer 133B, and an electron transporting layer 133C. Then, the substrate 110 and a sealing member 1111 are bonded together through an adhesive layer 1112 in an inactive gas such as nitride, thereby forming a sealing area S, thus forming a self-emission section consisting of organic EL elements 130 within the sealing area S.

The self-emission section consisting of organic EL elements 130, as shown in an example of FIG. 10, is so formed that its first electrodes 131 are divided by insulating strips 134, thereby forming a plurality of unit display areas (130R, 130G, 130B) by virtue of the respective organic EL elements 130 located under the divided first electrodes 131. Further, desiccating means 140 is attached to the inner surface of the sealing member 1111 forming the sealing area S, thereby preventing a deterioration of the organic EL elements 130 which is possibly caused due to moisture.

Moreover, on the lead-out area 110A formed along the edge of the substrate 110 there is formed a first electrode layer 1121A using the same material and the same step as forming the first electrodes 131, which is separated from the first electrodes 131 by the insulating strips 134. Further, on the lead-out portion of the first electrode layer 1121A there is formed a second electrode layer 1121B forming a low-resistant wiring portion containing a silver alloy or the like. In addition, if necessary, a protective coating layer 1121C consisting of IZO (Indium Zinc Oxide) or the like is formed on the second electrode layer 1121B. In this way, a lead-out wiring portion 1121 can be formed which consists of the first electrode layer 1121A, the second electrode layer 1121B, and the protective coating layer 1121C. Then, an edge portion 132a of each second electrode 132 is connected to the lead-out wiring portion 1121 at edge portion of the sealing area S.

Here, although the lead-out wiring portion of each first electrode 131 is not shown in the drawing, such lead-out wiring portion can be formed by extending each first electrode 131 and leading the same out of the sealing area S. Actually, such lead-out wiring portion can also be formed into an electrode layer forming a low resistant wiring portion containing a silver alloy or the like in a manner similar to an example associated with the above-described second electrode 132.

Then, an edge 1111E0 facing the lead-out wiring portion 1121 of the sealing member 1111 is formed by a hole processing edge formed before bonding together the substrate 110 and the sealing member 1111.

Next, description will be given in more detail to explain the details of the aforementioned organic EL unit 100a.

a. Electrodes

Either the first electrodes 131 or the second electrodes 132 are set as cathode side, while the opposite side is set as anode side. The anode side is formed by a material having a higher work function than the cathode side, using a transparent conductive film which may be a metal film such as chromium (Cr), molybdenum (Mo), nickel (Ni), and platinum (Pt), or a transparent electrically conductive film such as ITO and IZO. In contrast, the cathode side is formed by a material having a lower work function than the anode side, using a metal having a low work function, which may be an alkali metal (such as Li, Na, K, Rb, and Cs), an alkaline earth metal (such as Be, Mg, Ca, Sr, and Ba), a rare earth metal, a compound or an alloy containing two or more of the above elements, or an amorphous semiconductor such as a doped polyaniline and a doped polyphenylene vinylene, or an oxide such as $Cr_2O_3$, NiO, and $Mn_2O_5$. Moreover, when the first electrodes 131 and the second electrodes 132 are all formed by transparent materials, it is allowed to provide a reflection film on one electrode side opposite to the light emission side.

The lead-out wiring portions (the lead-out wiring portion 1121 and the lead-out wiring portion of the first electrodes 131, as shown in the figure) are connected with drive circuit parts driving the organic EL unit 100a or connected with a flexible wiring board. However, it is preferable for these lead-out wiring portions to be formed as having a low resistance as possible. Namely, the lead-out wiring portions can be formed by laminating low resistant metal electrode layers which may be Ag, Cr, Al or their alloys. Alternatively, they may be formed by single one electrode of low resistant metal.

b. Organic layer

Although the organic layer 133 comprises one or more layers of organic compound materials including at least one organic luminescent layer, its laminated structure can be in any desired arrangement. Usually, in the case of a low molecule organic EL material, as shown in FIG. 10, there is a laminated structure including, from the anode side towards the cathode side, a hole transporting layer 133A, a luminescent layer 33B, and an electron transporting layer 133C. Each of the hole transporting layer 133A, the luminescent layer 133B, and the electron transporting layer 133C can be in a single-layer or a multi-layered structure. Moreover, it is also possible to dispense with the hole transporting layer 133A and/or the electron transporting layer 133C. On the other hand, if necessary, it is allowed to insert other organic layers including a hole injection layer, and an electron injection layer. Here, the hole transporting layer 133A, the luminescent layer 133B, and the electron transporting layer 133C can be formed by any conventional materials (it is allowed to use either a high molecular material or a low molecular material).

Regarding to a luminescent material for forming the luminescent layer 133B, it is allowed to make use of a luminescence (fluorescence) obtained when the material returns from a singlet excited state to a base state or a luminescence (phosphorescence) obtained when it returns from a triplet excited state to a base state.

c. Sealing Member

In the organic EL unit 100, the sealing member 1111 for tightly covering organic EL elements 130 may be a plate-like member made of metal, glass, or plastic. Here, the sealing member may be a piece of material having a recess portion (a one-step recess or a two-step recess) formed by pressing, etching, or blasting. Alternatively, the sealing member may be formed by using a flat glass plate capable of forming a sealing area S between the flat glass plate and the substrate 110 by virtue of a spacer made of glass (or plastic). Further, it is also possible to employ an airtight sealing method which uses the above-described sealing member to form a sealing area S, or a solid sealing method in which a filling agent such as a resin or a silicon oil is sealed into the sealing space S, or a film sealing method in which the self-emission elements 130 are sealed up by a barrier film or the like.

d. Adhesive Agent

An adhesive agent forming the adhesive layer 1112 may be a thermal-setting type, a chemical-setting type (two-liquid mixture), or a light (ultraviolet) setting type, which can be formed by an acryl resin, an epoxy resin, a polyester, a polyolefine. Particularly, it is preferable to use an ultraviolet-setting epoxy resin adhesive agent which is quick to solidify without a heating treatment.

e. Desiccating Means

Desiccating means 140 may be a physical desiccating agent such as zeolite, silica gel, carbon, and carbon nanotube; a chemical desiccating agent such as alkali metal oxide, metal halides, chlorine dioxide; a desiccating-agent formed by dissolving an organometal complex in a petroleum system solvent such as toluene, xylene, an aliphatic organic solvent and the like; and a desiccating agent formed by dispersing desiccating particles in a transparent binder such as polyethylene, polyisoprene, and polyvinyl cinnamate.

f. Various Types of Organic EL Unit 100a

The organic EL unit 100a of the present invention can have various types without departing from the scope of the invention. For example, the light emission type of organic EL elements 130 can be bottom emission type which emit light from the substrate 110 side, or top emission type which emit light from the sealing member 1111 side (at this time, it is necessary for the sealing member 1111 to be made of a transparent material). Further, it is possible to adopt a multi-font structure. Moreover, an organic EL display unit 100a may be a single color display or a multi-color display. In order to form a multi-color display, it is possible to adopt a discriminated painting method or a method in which an organic EL unit 100a having one or more organic EL elements for emitting a single color (white or blue) is combined with a color conversion layer formed by a color filter or a fluorescent material (CF manner, CCM manner), a SOLED (transparent Stacked OLED) method in which two or more colors of unit display areas are laminated to form one unit display area, or a laser transfer method in which low molecular organic material having different luminescent colors are deposited in advance on to different films and then transferred to one substrate by virtue of thermal transfer using a laser. Besides, although the accompanying drawings show only a passive driving manner, it is also possible to adopt an active driving manner by adopting TFT substrate serving as substrate 110, forming thereon a flattening layer and further forming the first electrodes 131 on the flattening layer.

As described above, the self-emission unit 100 of the present invention has the self-emission module 10 and the frame 30. The frame 30 covers a part or the whole of the self-emission module 10 so as to protect the same, and has the fastening sections 33 for attaching the self-emission module 10 to the attachment base 113. Since the frame 30 is integrally formed with the self-emission module 10, it is possible to avoid some troublesome steps and thus reduce a manufacturing time. Further, the self-emission unit 100 of the present invention makes it possible to improve an attachment precision when it is attached to an attachment base.

While there has been described what are at present considered to be preferred embodiments of the present invention, it will be understood that various modifications may be made thereto, and it is intended that the appended claims cover all such modifications as fall within the true spirit and scope of the invention.

What is claimed is:

1. A self-emission unit comprising:
   a self-emission module having one or more self-emission elements each including a lower electrode formed on a substrate directly or through other layers, film layers laminated on the lower electrode, and an upper electrode formed over the film layers; and
   a frame covering a part or the whole of the self-emission module so as to protect the self-emission module, wherein the frame is formed integrally with the self-emission module,
wherein the frame has fastening sections formed on a side face or a back face of the frame, and said fastening sections have claw-like fastening portions capable of engaging with fastening portions of an attachment base to attach the self-emission module to the attachment base.

2. The self-emission unit according to claim 1, wherein the frame is formed integrally with the self-emission module in frame-molding or two-liquid mixing based on resin material.

3. The self-emission unit according to claim 1, wherein the self-emission module has a sealing member formed on the substrate for air-tightly sealing the self-emission elements,
wherein the frame is formed integrally with the self-emission module to cover a part or the whole of the sealing member.

4. The self-emission unit according to claim 1,
wherein the self-emission module has a driving circuit formed on the substrate for driving the self-emission elements,
wherein the frame is formed integrally with the self-emission module to cover a part or the whole of the driving circuit.

5. The self-emission unit according to claim 4,
wherein the self-emission module has a wiring board formed on the substrate, one end of the wiring board is electrically connected to the driving circuit and the other is connectable to an external circuit,
wherein the frame is formed integrally with the self-emission module to cover a part or the whole of the wiring board.

6. The self-emission unit according to claim 1, wherein the frame is formed integrally with the self-emission module to cover a part or the whole of the self-emission module except its display area.

7. The self-emission unit according to claim 1, wherein the frame is formed integrally with the self-emission module to cover a part or the whole of edge portion of the substrate.

* * * * *